(12) United States Patent
Hosokawa et al.

(10) Patent No.: US 9,303,191 B2
(45) Date of Patent: Apr. 5, 2016

(54) POLISHING COMPOSITION

(71) Applicant: NITTA HAAS INCORPORATED, Osaka (JP)

(72) Inventors: Koichiro Hosokawa, Kyoto (JP); Yoshiharu Ota, Kyoto (JP); Shoichiro Yoshida, Kyoto (JP)

(73) Assignee: NITTA HAAS INCORPORATED, Osaka (JP)

( * ) Notice: Subject to any disclaimer, the term of this patent is extended or adjusted under 35 U.S.C. 154(b) by 0 days.

(21) Appl. No.: 14/359,357

(22) PCT Filed: Mar. 28, 2013

(86) PCT No.: PCT/JP2013/059311
§ 371 (c)(1),
(2) Date: May 20, 2014

(87) PCT Pub. No.: WO2013/147046
PCT Pub. Date: Oct. 3, 2013

(65) Prior Publication Data
US 2015/0053887 A1 Feb. 26, 2015

(51) Int. Cl.
*C09G 1/02* (2006.01)
*H01L 21/321* (2006.01)
*C09K 3/14* (2006.01)

(52) U.S. Cl.
CPC ... *C09G 1/02* (2013.01); *C09K 3/14* (2013.01); *H01L 21/3212* (2013.01)

(58) Field of Classification Search
CPC .............. C23F 1/00; C23F 3/00; C23G 1/00; C23G 5/00; C09K 13/12; C09G 1/02
USPC ................................................ 252/79.1, 79.2
See application file for complete search history.

(56) References Cited

U.S. PATENT DOCUMENTS

| | | | |
|---|---|---|---|
| 2005/0178742 A1* | 8/2005 | Chelle et al. | 216/88 |
| 2005/0233578 A1* | 10/2005 | Jia et al. | 438/633 |
| 2007/0068087 A1* | 3/2007 | Carter et al. | 51/308 |
| 2008/0289261 A1* | 11/2008 | Hattori et al. | 51/308 |
| 2010/0207058 A1* | 8/2010 | Matsumura et al. | 252/79.1 |
| 2011/0070735 A1* | 3/2011 | Shi | 438/692 |

FOREIGN PATENT DOCUMENTS

| | | |
|---|---|---|
| CN | 1487867 | 4/2004 |
| CN | 101608098 | 12/2009 |
| JP | 10-265766 | 10/1998 |
| JP | 2003-59877 | 2/2003 |
| JP | 2004-123880 | 4/2004 |
| JP | 2004-526302 | 8/2004 |
| JP | 2004-253058 | 9/2004 |
| JP | 2005-516384 | 6/2005 |
| JP | 2005-518089 | 6/2005 |
| JP | 4083528 | 2/2008 |
| JP | 2004-123879 | 4/2008 |
| JP | 2008-135452 | 6/2008 |
| JP | 2008-135453 | 6/2008 |
| JP | 4166487 | 8/2008 |
| JP | 2009-543336 | 12/2009 |
| TW | 200811277 | 3/2008 |

* cited by examiner

*Primary Examiner* — Shamim Ahmed
(74) *Attorney, Agent, or Firm* — Clark & Brody

(57) ABSTRACT

The polishing composition of the present invention is a polishing composition for polishing a tungsten-containing metal layer formed on an insulating layer, the polishing composition comprising: abrasive grains; one or more halogen acids selected from the group consisting of iodic acid, iodous acid, and hypoiodous acid; a strong acid; a hydrogen-ion-supplying agent; and water.

4 Claims, 4 Drawing Sheets

POLISHING COMPOSITION

CROSS REFERENCE TO RELATED APPLICATIONS

The present application claims priority from Japanese Patent Application No. 2012-081653, the contents of which are incorporated herein by reference.

FIELD OF THE INVENTION

The present invention relates to a polishing composition for polishing a tungsten-containing metal layer formed on an insulating layer.

RELATED ART

In the manufacturing process of a semiconductor device, a wiring structure is manufactured using a chemical mechanical polishing method (CMP method: Chemical Mechanical Polishing).

A method for manufacturing a wiring structure by such a CMP method includes: for example, forming a metal layer such as a barrier layer and a conductor layer in a recess formed in an insulating layer containing SiO, tetraethoxysilane (TEOS), or the like and on the upper surface of the insulating layer around the recess; and removing an excess metal layer formed on the surface of the insulating layer other than the recess by polishing with a polishing composition containing abrasive grains until the surface of the insulating layer is exposed, thereby forming a wiring embedded in the recess.

A metal such as tungsten is used for the conductor layer, and a metal such as titanium, titanium nitride, tantalum, and tantalum nitride is used for the barrier layer. Therefore, high polishing properties for a metal layer including the conductor layer, the barrier layer, and the like is required for a polishing composition used in a CMP method.

On the other hand, a polishing composition having high corrosiveness to the metal layer causes dishing, that is, a hollow on the upper surface of the wiring, which is formed by excessively removing the metal layer on the recess.

Further, a polishing composition having high corrosiveness to the metal layer and a high polishing rate for the insulating layer causes erosion in which, in a fine recess for wiring, not only the upper surface of the wiring but also the insulating layer are eroded.

The smoothness of a polished surface is reduced by the occurrence of such dishing and erosion.

Therefore, a polishing composition used in a CMP method is required not only to have high polishing properties for a metal layer but also to suppress the occurrence of dishing and erosion.

However, in the case of a polishing composition for polishing a metal layer containing a relatively hard metal such as tungsten, it is difficult to selectively increase the polishing rate for a metal layer while suppressing dishing and erosion.

Examples of the polishing composition used for polishing such a tungsten-containing metal layer by a CMP method include those described in Patent Literatures 1 to 7.

Patent Literatures 1 and 2 describe a polishing composition containing colloidal silica as abrasive grains and hydrogen peroxide as an oxidizing agent.

Patent Literatures 3 and 4 describe a polishing composition containing abrasive grains and periodic acid.

These polishing compositions form a weak oxide film on tungsten with an oxidizing agent such as hydrogen peroxide or periodic acid and mechanically polish the oxide film with colloidal silica.

However, these polishing compositions have a problem that the polishing rate for a metal layer such as tungsten is low, and polishing efficiency is low.

Patent Literatures 5 to 7 describe a polishing composition containing colloidal silica or fumed silica as abrasive grains, periodic acid, and ammonium sulfate.

In this case, since the polishing composition contains ammonium nitrate in combination with periodic acid, the polishing rate for a metal layer is slightly increased by the action of ammonium nitrate. However, since periodic acid has strong corrosive action to a metal such as tungsten, suppression of dishing and erosion is difficult to be achieved, and an apparatus may be corroded to generate rust.

CITATION LIST

Patent Literature

Patent Literature 1: Japanese Patent Application Laid-Open No. 2008-135453
Patent Literature 2: Japanese Patent Application Laid-Open No. 2008-135452
Patent Literature 3: Japanese Patent No. 4083528
Patent Literature 4: Japanese Patent Application Laid-Open No. 2003-59877
Patent Literature 5: Japanese Patent No. 4083528
Patent Literature 6: Japanese Patent Application Laid-Open No. 2004-123880
Patent Literature 7: Japanese Patent Application Laid-Open No. 2004-123879

SUMMARY OF THE INVENTION

Problems to be Solved by the Invention

Thus, in view of the above conventional problems, an object of the present invention is to provide a polishing composition which can selectively polish a tungsten-containing metal layer formed on an insulating layer with a high polishing rate while suppressing dishing, erosion, and the like.

Means for Solving Problems

The polishing composition according to the present invention is
a polishing composition for polishing a tungsten-containing metal layer formed on an insulating layer, the polishing composition comprising:
abrasive grains;
one or more halogen acids selected from the group consisting of iodic acid, iodous acid, and hypoiodous acid;
a strong acid;
a hydrogen-ion-supplying agent; and
water.

In the present invention, the hydrogen-ion-supplying agent may be one or more selected from the group consisting of a salt of a strong acid and a weak base, and a weak acid.

In the present invention, the strong acid may be one or more selected from the group consisting of nitric acid, hydrochloric acid, and sulfuric acid.

In the present invention, the abrasive grains may be fumed silica.

DESCRIPTION OF EMBODIMENTS

Figure 1:
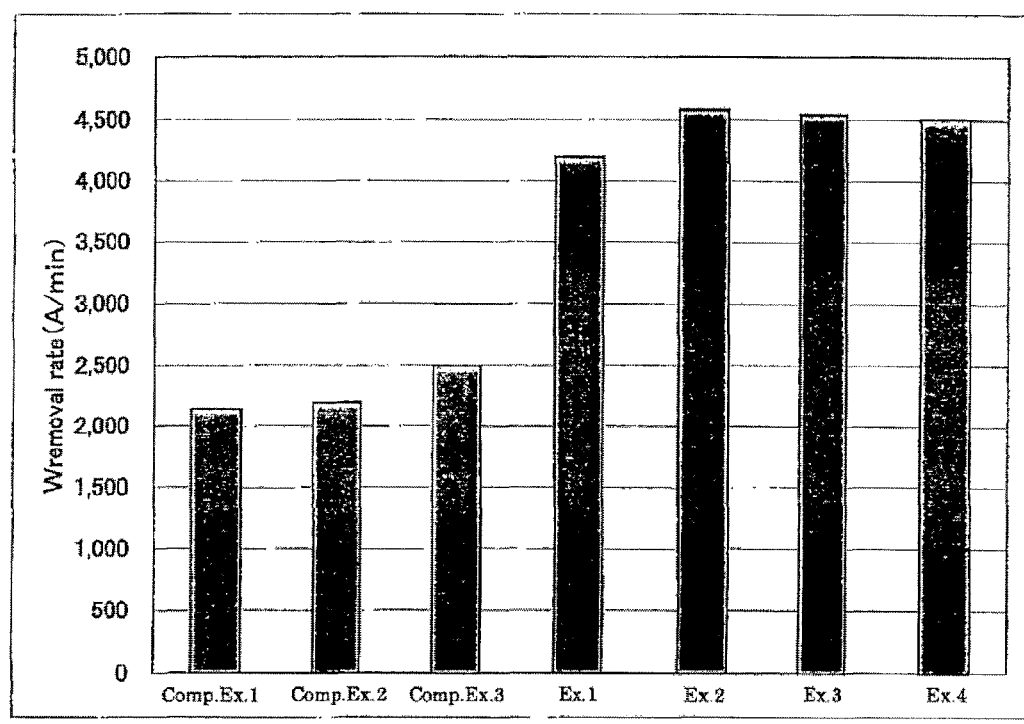
FIG. 1 is a graph showing the polishing rate of a polishing composition according to one embodiment of the present invention.

Hereinafter, the polishing composition according to the present invention is described.

The polishing composition of the present embodiment is a polishing composition for polishing a tungsten-containing metal layer formed on an insulating layer, and contains the following components A to D and water.

(A) Abrasive grains
(B) Halogen acid
(C) Strong acid
(D) Hydrogen-ion-supplying agent (A) Abrasive Grains The polishing composition of the present embodiment contains abrasive grains. The abrasive grains are not particularly limited as long as they are used as abrasive grains in a polishing composition for a CMP method. Examples thereof include colloidal silica, fumed silica, alumina, cerium oxide, silicon nitride, and zirconium oxide. These may be used singly or in combination of two or more.

Among them, fumed silica is preferred. Fumed silica is preferably used as abrasive grains because the polishing rate for an insulating layer can be suppressed, and the polishing rate for tungsten can be increased.

(B) Halogen Acid

The polishing composition of the present embodiment contains one or more halogen acids selected from the group consisting of iodic acid, iodous acid, and hypoiodous acid. Each of the halogen acids may be used singly or in combination of two or more.

The halogen acid functions as an oxidizing agent for oxidizing tungsten contained in a metal layer.

The one or more halogen acids selected from the group consisting of iodic acid, iodous acid, and hypoiodous acid are suitable as an oxidizing agent of a polishing composition because they do not corrode tungsten and have a high reaction rate in oxidizing tungsten.

Among them, iodic acid is particularly preferred because it has an oxidizing power which is high to such an extent that tungsten is not corroded, and has a high rate of oxidation reaction for tungsten.

(C) Strong Acid

The polishing composition of the present embodiment contains a strong acid.

The strong acid is ionized in the polishing composition to thereby supply hydrogen ions required in the oxidation reaction in which the halogen acid oxidizes tungsten.

Examples of the strong acid include, but are not limited to, nitric acid, hydrochloric acid, and sulfuric acid. These can be used singly or in combination of two or more.

Among them, nitric acid is preferably used because it is not liable to generate corrosive gas and has little risk of corroding a polishing apparatus and the like.

Note that, as used in the present embodiment, the strong acid refers to an acid having a first acid dissociation constant pKa1 of less than 1, and the weak acid refers to an acid having a first acid dissociation constant pKa1 of 1 or more.

(D) Hydrogen-Ion-Supplying Agent

The polishing composition of the present embodiment contains a hydrogen-ion-supplying agent.

According to the reactions to be described below, the hydrogen-ion-supplying agent supplies hydrogen ions required for the oxidation reaction in which the halogen acid in combination with the strong acid oxidizes tungsten, while at the same time maintains the hydrogen-ion concentration required for the oxidation reaction.

The hydrogen-ion-supplying agent is preferably one or more selected from the group consisting of a salt of a strong acid and a weak base, and a weak acid.

Examples of the salt consisting of a strong acid and a weak base include ammonium nitrate, ammonium sulfate, and ammonium chloride.

Weak acids each having a dissociation region in an acidic region is preferred as the weak acid, and among them, phosphoric acid, lactic acid, maleic acid, oxalic acid, and the like are preferred.

Since both a salt of a strong acid and a weak base and a weak acid can stably supply hydrogen ions when the concentration of hydrogen ions is low, they are suitable as a hydrogen-ion-supplying agent of the present embodiment.

The salts each consisting of a strong acid and a weak base are particularly preferred as the hydrogen-ion-supplying agent because they can stably supply hydrogen ions by their buffer effect. Among them, ammonium nitrate is particularly preferably used in terms of supply efficiency of hydrogen ions.

Each of the salt of a strong acid and a weak base and the weak acid can be used singly or in combination of two or more.

In the polishing composition of the present embodiment, the components A to D are dissolved in water.

The water to be used is preferably water such as ion exchange water which contains impurities as small as possible, in order to suppress the inhibition of various actions of the components A to D.

The polishing composition of the present embodiment may contain other components such as a corrosion inhibitor and a substance for suppressing the occurrence of bacteria and germs besides the components A to D and water.

The amount of each component of the halogen acid, the strong acid, and the hydrogen-ion-supplying agent blended into the polishing composition of the present embodiment is preferably determined so as to satisfy the following relationship.

That is, when the hydrogen-ion concentration required for the oxidation of tungsten by the halogen acid is defined as X mol/liter, the halogen acid, the strong acid, and the hydrogen-ion-supplying agent are preferably blended so that the total concentration Y mol/liter of hydrogen ions supplied from the strong acid and the hydrogen-ion-supplying agent and the hydrogen-ion concentration X satisfy the following relationship.

$$1.2 \times Y \div X > 1 \tag{1}$$

For example, when iodic acid is used as a halogen acid in a reaction in which tungsten is oxidized by the halogen acid, ionization and reduction reaction of iodic acid proceed as follows in an acidic solution.

Ionization of iodic acid: $HIO_3 = H^+ + IO_3^-$

Reduction of iodic acid: $IO_3^- + 6H^+ + 5e^- = \frac{1}{2}I_2 + 3H_2O$

That is, in the reaction in which iodic acid oxidizes tungsten, the $\frac{1}{6}X$ mol of the iodic acid is reduced by X mol of hydrogen ions.

On the other hand, when iodic acid is dissolved in an acidic solution, it ionizes as follows in the same manner as described above.

$$HIO_3 = IO_3^- + H^+$$

That is to say, when iodic acid in an amount reduced by X mol of hydrogen ions, that is, $\frac{1}{6}X$ mol of iodic acid is blended into a polishing composition, $\frac{1}{6}X$ mol of hydrogen ions are generated. However, hydrogen ions required for oxidizing tungsten cannot be fully supplied only by these hydrogen ions.

Therefore, a strong acid is blended to supply hydrogen ions required for the oxidation of tungsten.

When nitric acid is used as a strong acid, nitric acid is ionized as follows in a polishing composition.

Ionization of nitric acid: $HNO_3 = NO_3^- + H^+$

That is to say, when a mol of nitric acid is blended into a polishing composition, a mol of hydrogen ions are generated. Assuming that hydrogen ions required for the oxidation of tungsten are supplied from the iodic acid and nitric acid, in the case where $\frac{1}{6}X$ mol of iodic acid and a mol of nitric acid are blended into a certain amount of polishing composition in order to perform the reaction with X mol of the hydrogen ions, when the relationship:

$$\frac{1}{6}X + a > X$$

is satisfied, oxidation reaction of tungsten theoretically proceeds.

However, in the actual polishing composition, the oxidation reaction rate of tungsten is not sufficiently increased only by the supply of hydrogen ions from a strong acid.

The reason is not certain, but is probably because as follows. When hydrogen ions are supplied only from a strong acid, it may be possible to supply a required amount of hydrogen ions for the whole polishing composition, but it is difficult to adjust the amount of hydrogen ions in the vicinity of a metal layer surface where the oxidation reaction is occurring to a sufficient amount at the timing when the oxidation reaction is occurring.

In the present embodiment, hydrogen ions that contribute to oxidation reaction are stably and sufficiently supplied in a polishing composition by blending the hydrogen-ion-supplying agent into the polishing composition. As a result, the oxidation reaction rate of tungsten can be increased.

When ammonium nitrate is used as the hydrogen-ion-supplying agent, ammonium nitrate is ionized as follows in a solution.

Ionization of ammonium nitrate: $NH_4NO_3 = NH_4^+ + NO_3^-$

Further, ammonium ions produced in the ionization of ammonium nitrate produce hydrogen ions in the reduction reaction.

Reduction reaction of ammonium ions: $NH_4^+ = NH_3 + H^+$

That is to say, when b mol of ammonium nitrate is blended into a certain amount of polishing composition, b mol of hydrogen ions are produced.

When the amounts of iodic acid, nitric acid, and ammonium nitrate to be blended into the polishing composition of the present embodiment are $\frac{1}{6}X$ mol of iodic acid (the amount that reacts with X mol of hydrogen ions), a mol of nitric acid (the amount that produces a mol of hydrogen ions), and b mol of ammonium nitrate (the amount that produces b mol of hydrogen ions), respectively, the amounts that can effectively increase the polishing rate for tungsten satisfies the following relationship.

$$\frac{1}{6}X + a + b > X, \text{ that is, } 1.2 \times (a+b) \div X > 1$$

Here, when a+b is defined as Y, the formula (1) is obtained.

The polishing composition of the present embodiment can provide a high polishing rate for tungsten when it contains iodic acid, nitric acid, and ammonium nitrate so that these components may satisfy the formula (1).

Further, the following formula (2) is also obtained from the formula (1).

$$1.2Y > X \tag{2}$$

That is to say, the polishing rate for tungsten is increased by setting the ratio 1.2Y/X of 1.2Y to the amount X of hydrogen ions required for the oxidation of tungsten at more than 1.

However, in order to increase the polishing rate by satisfying the formula (1), it is preferred that the halogen acid be blended in an amount such that the hydrogen-ion concentration required for the oxidation of tungsten is 0.01 mol/liter or more, preferably 0.1 mol/liter or more and 1.0 mol/liter or less. When the halogen acid is blended in the above range, the halogen acid in an amount required as an oxidizing agent for oxidizing tungsten is contained, and the oxidation reaction may not be suppressed.

The specific amount of blending of the components (A) to (D) of the polishing composition of the present embodiment is, for example, in the following ranges. Note that the balance of the components (A) to (D) and other components optionally blended is water.

(A) Amount of Blending of Abrasive Grains

The amount of the abrasive grains blended into the polishing composition of the present embodiment is, for example, 0.1% by mass to 20% by mass, preferably 1% by mass to 10% by mass, most preferably 2% by mass to 5% by mass.

When the abrasive grains are blended within the above range, the polishing rate for a metal layer can be brought into a preferred range, and the occurrence of erosion, dishing, and the like can be suppressed.

(B) Halogen Acid

The amount of the halogen acid blended into the polishing composition of the present embodiment is, for example, 0.01% by mass to 10% by mass, preferably 0.1% by mass to 3% by mass, most preferably 0.2% by mass to 1% by mass.

When the halogen acid is blended within the above range, the polishing rate for the metal layer can be brought into a preferred range.

When iodic acid is used as the halogen acid, the amount of blending thereof is, for example, 0.01% by mass to 5% by mass, preferably 0.1% by mass to 2% by mass, most preferably 0.2% by mass to 1% by mass.

(C) Strong Acid

The amount of the strong acid blended into the polishing composition of the present embodiment is, for example, 0.001% by mass to 5% by mass, preferably 0.005% by mass to 1% by mass, most preferably 0.001% by mass to 0.2% by mass.

When the strong acid is blended within the above range, the polishing rate for the metal layer can be brought into a preferred range.

When nitric acid is used as the strong acid, the amount of blending thereof is, for example, 0.001% by mass to 2% by mass, preferably 0.01% by mass to 0.5% by mass, most preferably 0.02% by mass to 0.1% by mass.

(D) Hydrogen-Ion-Supplying Agent

The amount of the hydrogen-ion-supplying agent blended into the polishing composition of the present embodiment is, for example, 0.01% by mass to 10% by mass, preferably 0.1% by mass to 6% by mass, most preferably 0.3% by mass to 3% by mass.

When the hydrogen-ion-supplying agent is blended within the above range, the polishing rate for the metal layer can be brought into a preferred range.

Further, the hydrogen-ion-supplying agent and the strong acid are preferably blended into the polishing composition at a ratio of strong acid:hydrogen-ion-supplying agent=1:1 to 1:50, preferably 1:2 to 1:12 in terms of the molar concentration ratio of the hydrogen ions ionized from the respective components.

By blending the hydrogen-ion-supplying agent and the strong acid in such a ratio, the polishing rate for the metal layer can be brought into a more preferred range.

When ammonium nitrate is used as the hydrogen-ion-supplying agent, the amount of blending thereof is, for example, 0.01% by mass to 10% by mass, preferably 0.1% by mass to 5% by mass, most preferably 0.3% by mass to 2% by mass.

When other components as described above are contained, the amount of blending thereof is, for example, 2% by mass or less, preferably 0.01% by mass to 2% by mass.

Note that although the polishing composition according to the present embodiment is as described above, the embodiments disclosed herein must be regarded as being not restrictive but illustrative in all points. The scope of the present invention is shown not by the above description but by the claims, and is intended to include all modifications within the equivalent meaning and scope to the claims.

According to the present invention, a tungsten-containing metal layer formed on an insulating layer can be selectively polished with a high polishing rate while suppressing dishing, erosion, and the like.

That is, a tungsten-containing metal layer formed on an insulating layer can be polished at a high polishing rate, and the polishing rate for the insulating layer can be suppressed. Therefore, the metal layer can be selectively polished. Further, since the corrosiveness to the metal layer is low, dishing, erosion, and the like can be suppressed.

In the present invention, the hydrogen-ion-supplying agent may be one or more selected from the group consisting of a salt of a strong acid and a weak base, and a weak acid. In this case, the hydrogen-ion-supplying agent, in combination with a strong acid, supplies hydrogen ions required by the halogen acid in the polishing of a metal layer. By using a salt of a strong acid and a weak base and/or a weak acid as the hydrogen-ion-supplying agent, the hydrogen ions required for the oxidation of tungsten can be stably contained in the polishing composition, and the polishing rate for the metal layer is further increased.

Further, when one or more selected from the group consisting of nitric acid, hydrochloric acid, and sulfuric acid are used as the strong acid in the present invention, the hydrogen ions required by the halogen acid in the polishing of a metal layer can be sufficiently supplied, and the polishing rate for the metal layer is further increased.

Furthermore, when fumed silica is used as abrasive grains in the present invention, the polishing rate for a metal layer can be increased while further suppressing the polishing rate for an insulating layer.

EXAMPLES

Hereinafter, the present invention is further described with reference to Examples, but the present invention is not limited thereto.

(Polishing Composition)

Polishing compositions each having a formulation shown in the following Table 1 were prepared.

The materials used are as follows.

(A) Abrasive grains: fumed silica (a specific surface area of 85 $m^2/g$)

(B) Iodic acid: 50% (% by mass in the table is % by mass as $HIO_3$)

(C) Nitric acid: 61% (% by mass in the table is % by mass as $HNO_3$)

(D) Ammonium nitrate: 99% in purity (% by mass in the table is % by mass as $HH_4NO_3$)

The components (A) to (D) and ion exchange water were put in a container and mixed to prepare polishing compositions of Examples 1 to 4 and Comparative Example 1.

Further, in Comparative Examples 2 and 3, ammonia was blended instead of the strong acid as a component C, and the following components were blended instead of the ammonium nitrate as a component D, in an amount shown in Table 1, respectively.

Phosphoric acid: 85% (% by mass in the table is % by mass as $H_3PO_4$)

Maleic acid: 99% (% by mass in the table is % by mass as $C_4H_4O_4$)

Ammonia: 29% (% by mass in the table is % by mass as $NH_3$)

The values of $1.2 \times Y$ and $1.2Y \div X$ are shown in the table, wherein, in each polishing composition, X refers to the molar concentration of hydrogen ions required for oxidation by iodic acid, and Y refers to the molar concentration of the total (a+b) of hydrogen ions (a) supplied from nitric acid to the polishing composition and hydrogen ions (b) supplied from ammonium nitrate.

Note that each value was calculated by defining b=0, that is, Y=c in Comparative Example 1, defining Y to be the concentration of the total hydrogen ions supplied from ammonia and phosphoric acid in Comparative Example 2, and defining Y to be the concentration of the total hydrogen ions supplied from ammonia and maleic acid in Comparative Example 3.

TABLE 1

| | A Wt % | B Wt % | C Wt % | D Wt % | X mol/l | Y = a + b mol/l | 1.2*Y mol/l | 1.2*Y/X mol/l | W polishing rate Å/min |
|---|---|---|---|---|---|---|---|---|---|
| Comparative Example 1 | 3 | 0.3 | 0.15 | 0 | 0.102 | 0.03 | 0.04 | 0.35 | 2,141 |
| Comparative Example 2 | 3 | 0.5 | Ammonia 0.045 | Phosphoric acid 1 | 0.17 | 0.13 | 0.16 | 0.92 | 2,493 |
| Comparative Example 3 | 3 | 0.5 | Ammonia 0.05 | Maleic acid 1 | 0.17 | 0.12 | 0.14 | 0.85 | 2,192 |
| Example 1 | 3 | 0.3 | 0.12 | 0.5 | 0.102 | 0.09 | 0.11 | 1.06 | 4,194 |
| Example 2 | 3 | 0.3 | 0.12 | 1 | 0.102 | 0.16 | 0.19 | 1.88 | 4,584 |
| Example 3 | 3 | 0.3 | 0.11 | 2 | 0.102 | 0.28 | 0.34 | 3.29 | 4,543 |
| Example 4 | 3 | 0.3 | 0.1 | 3 | 0.102 | 0.41 | 0.49 | 4.82 | 4,506 |

(Measurement of Polishing Rate)

Wafers were polished under the following conditions to measure each polishing rate.

<<Polishing Conditions>>

Polishing apparatus: EP0222D (manufactured by EBARA CORPORATION)
Polishing pad: IC1000 AT KA1B Pad DN1 29.1" PJP6: BA05 A6 (manufactured by Nitta Haas Incorporated)
Platen speed: 80/83 rpm
Polishing load surface pressure: 5.5 psi
Flow rate of polishing composition: 150 ml/min
Material to be polished:
  Material to be polished 1: A silicon wafer (200 mm in diameter) with the surface thereof covered with a tungsten layer having a thickness of 0.8 μm (=8000 Å)
  Material to be polished 2: A silicon wafer (200 mm in diameter) with the surface thereof covered with a TEOS layer having a thickness of 1.0 μm (=10000 Å)
  Material to be polished 3: A silicon wafer with a TEG patterned layer of TEOS and tungsten formed on the surface thereof (in which the TEOS layer is not exposed) Polishing time: 60 s <<Method for Measuring Tungsten Polishing Rate>>

Polished thickness was divided by polishing time to determine the polishing rate per unit time.

The polished thickness was determined by measuring the thickness of a tungsten layer on the surface of a wafer of the material to be polished 1 before polishing and after polishing and subtracting the thickness of the tungsten layer after polishing from the thickness of the tungsten layer before polishing.

Note that the polished thickness was measured using a tester instrument for measuring sheet resistance (instrument name: RT-80, manufactured by Napson Corporation).

The results are shown in Table 1 and FIG. 1.

It is apparent from Table 1 and FIG. 1 that the polishing rate in each Example is higher than that in Comparative Example 1 in which a component D is not contained and those in Comparative Examples 2 and 3 in which a strong acid is not contained as a component C.

Figure 2:
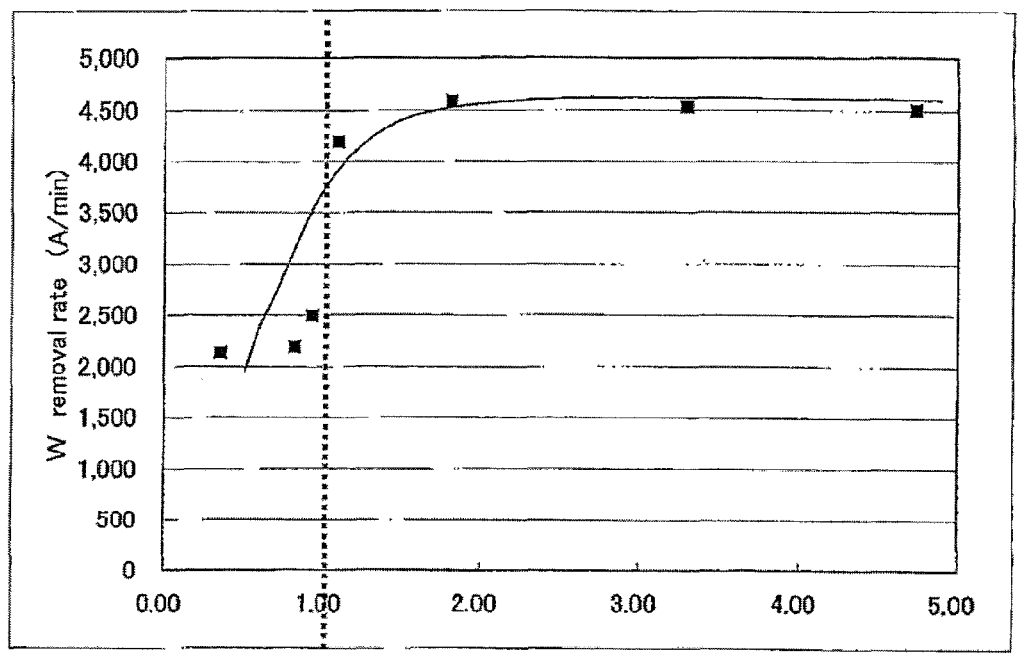
FIG. 2 is a graph showing the relationship between the polishing rate and the blending ratio of a polishing composition according to one embodiment of the present invention.

Further, FIG. 2 shows a graph in which the relationship between the polishing rate in each Example and Comparative Example and 1.2Y÷X is plotted by taking the values of 1.2Y÷X on the abscissa.

The graph of FIG. 2 shows that when the values of 1.2Y÷X exceed 1.0, the polishing rate sharply increases.

Next, polishing compositions of Examples 5 to 10 and Comparative Examples 4 to 9 were each prepared in a formulation shown in Table 2 in the same manner as in Examples 1 to 4 and Comparative Examples 1 to 3.

Polishing compositions in Comparative Examples 4 and 5 do not contain a component D.

In Comparative Examples 6 and 7, the following periodic acid was blended instead of iodic acid as a component B.

Periodic acid: 50% (% by mass in the table is % by mass as $HIO_4$)

The following commercially available polishing compositions were used in Comparative Examples 8 and 9.

Commercially available product A: trade name "PLANERLITE-5107" (periodic acid-based polishing composition), manufactured by FUJIMI INCORPORATED Commercially available product B: trade name "SemiSperse W2000" (hydrogen peroxide-based polishing composition), manufactured by Cabot Corporation

TABLE 2

| | A Wt % | B Wt % | C Wt % | D Wt % | X mol/l | Y = a + b mol/l | 1.2*Y mol/l | 1.2*Y/X mol/l | W polishing rate Å/min | TEOS polishing rate Å/min | W/TEOS Polishing rate ratio | W etching rate Å/min | SUS corrosiveness | Dishing Å | Erosion Å |
|---|---|---|---|---|---|---|---|---|---|---|---|---|---|---|---|
| Example 5 | 3 | 0.3 | 0.12 | 1.0 | 0.102 | 0.16 | 0.19 | 1.82 | 4,584 | 104 | 44 | 0 | Good | 650 | 50 |
| Example 6 | 3 | 0.3 | 0.11 | 2.0 | 0.102 | 0.28 | 0.34 | 3.29 | 4,543 | 108 | 42 | 0 | Good | | |
| Example 7 | 3 | 0.3 | 0.10 | 3.0 | 0.102 | 0.41 | 0.49 | 4.75 | 4,505 | 109 | 41 | 0 | Good | | |
| Example 8 | 2.5 | 0.4 | 0.09 | 1.0 | 0.136 | 0.16 | 0.19 | 1.36 | 3,936 | 96 | 41 | 0 | Good | | |
| Example 9 | 3 | 0.3 | 0.12 | 0.1 | 0.102 | 0.04 | 0.05 | 0.5 | 2,530 | 108 | 23 | 0 | Good | | |
| Example 10 | 3 | 0.3 | 0.12 | 0.5 | 0.102 | 0.09 | 0.11 | 1.09 | 4,194 | 106 | 40 | 0 | Good | | |
| Comparative Example 4 | 3 | 0.3 | 0.15 | 0.0 | 0.102 | 0.03 | 0.04 | 0.35 | 2,141 | 101 | 21 | 0 | Good | | |
| Comparative Example 5 | 2.5 | 0.4 | 0.09 | 0.0 | 0.136 | 0.03 | 0.04 | 0.26 | 1,561 | 99 | 16 | 0 | Good | | |
| Comparative Example 6 | 2.5 | Periodic acid 0.4 | 0.12 | 0.0 | 0.105 | 0.03 | 0.04 | 0.34 | 1,474 | 97 | 15 | 320 | Poor | | |

TABLE 2-continued

| | A Wt % | B Wt % | C Wt % | D Wt % | X mol/l | Y = a + b mol/l | 1.2*Y mol/l | 1.2*Y/X mol/l | W polishing rate Å/min | TEOS polishing rate Å/min | W/TEOS Polishing rate ratio | W etching rate Å/min | SUS corrosiveness | Dishing Å | Erosion Å |
|---|---|---|---|---|---|---|---|---|---|---|---|---|---|---|---|
| Comparative Example 7 | 2.5 | Periodic acid 0.4 | 0.12 | 1.0 | 0.105 | 0.16 | 0.19 | 1.77 | 3,801 | 98 | 39 | 334 | Poor | | |
| Comparative Example 8 | Commercially available product A | | | | | | | | 3,216 | 2201 | 1.5 | 109 | Poor | | |
| Comparative Example 9 | Commercially available product B | | | | | | | | 4,481 | 41 | 109 | 338 | Good | 1200 | 120 |

<<Measurement of Tungsten Polishing Rate>>

The polishing rate for tungsten was measured using each of the polishing compositions of Examples 5 to 10 and Comparative Examples 4 to 9 in the same manner as in Examples 1 to 4 and Comparative Examples 1 to 3.

<<Method for Measuring TEOS Polishing Rate>>

The polishing rate for a TEOS film of the material to be polished 2 was measured by the following methods using each of the polishing compositions of Examples 5 to 10 and Comparative Examples 4 to 9.

<<Method for Measuring TEOS Polishing Rate>>

Polished thickness was divided by polishing time to determine the polishing rate per unit time.

The polished thickness was determined by measuring the thickness of a TEOS layer on the surface of a wafer of the material to be polished 2 before polishing and after polishing and subtracting the thickness of the TEOS layer after polishing from the thickness of the TEOS layer before polishing.

Note that the polished thickness was measured using a transmission thickness measurement device (device name: OP2600, manufactured by THERMA-WAVE Inc.).

<<Tungsten/TEOS Polishing Rate Ratio>>

A ratio in which the polishing rate for tungsten was divided by the polishing rate for TEOS was calculated.

<<Tungsten Etching Rate>>

Each of the polishing compositions of Examples 5 to 10 and Comparative Examples 4 to 9 was heated to 50° C., in which a test piece with a tungsten film was immersed for 1 minute. Then, the decrement of the thickness of the tungsten film was measured.

<<SUS Corrosiveness>>

Each of the polishing compositions of Examples 5 to 10 and Comparative Examples 4 to 9 was heated to 50° C., in which a SUS 303 test piece (20 mm×20 mm×3 mm) was immersed for one week. Then, the presence or absence of the occurrence of rust was visually observed. A test piece in which rust occurred was determined to be poor, and a test piece in which rust did not occur was determined to be good.

<<Measurement of Dishing/Erosion>>

Dishing and erosion were measured.

The measurement methods are as follows.

The material to be polished 3 was polished using each of the polishing compositions of Examples 5 to 10 and Comparative Examples 4 to 9 under the same polishing conditions as described above.

The period of time until a TEOS film was exposed from a tungsten TEG pattern on a silicon wafer was defined as the polishing time.

Subsequently, dishing was measured at a line having a width of 50 µm in a location with a density of 50%, and erosion was measured at a line having a width of 1 µm in a location with a density of 17%, using P-12 manufactured by KLA-Tencor Corporation.

The results are shown in Table 2.

It is apparent from Table 2 that the polishing rate is higher in Examples than in Comparative Examples 4 and 5 in which a component D is not contained.

In Comparative Examples 6 and 7 in which periodic acid was contained instead of iodic acid as a component B, the corrosiveness to SUS was high, and the corrosiveness (etching rate) of tungsten was also high.

In Comparative Example 9 in which a hydrogen peroxide-based commercially available polishing composition was used, the corrosiveness to SUS was low, but the corrosiveness to tungsten was high.

Figure 3:
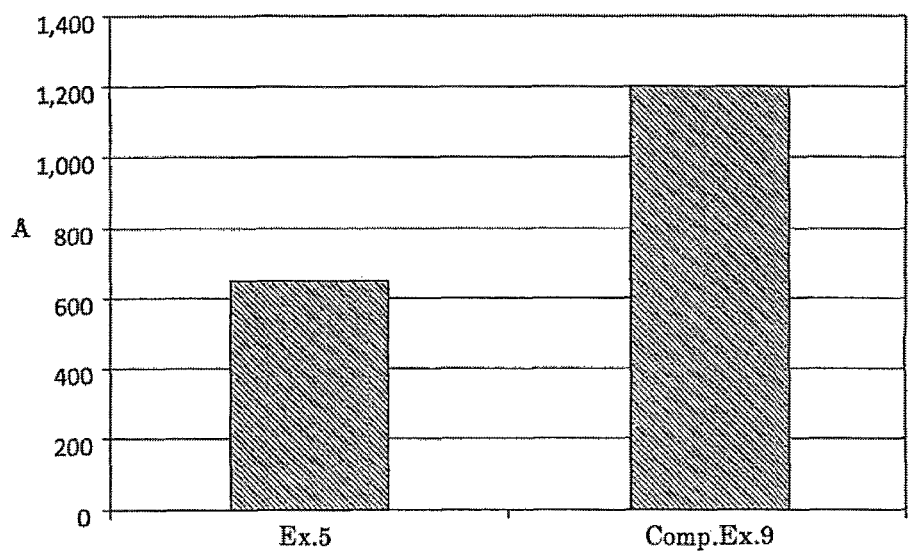
FIG. 3 is a graph showing the state of dishing in the case of polishing with a polishing composition.
Figure 4:
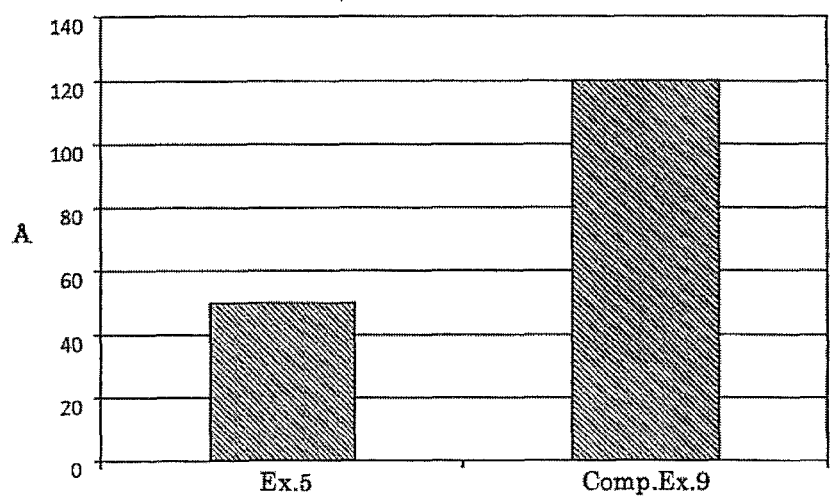
FIG. 4 is a graph showing the state of erosion in the case of polishing with a polishing composition.

As shown in Table 2 and FIGS. 3 and 4, dishing and erosion in the polishing in Example 5 were extremely smaller than those in Comparative Example 9.

Figure 5:
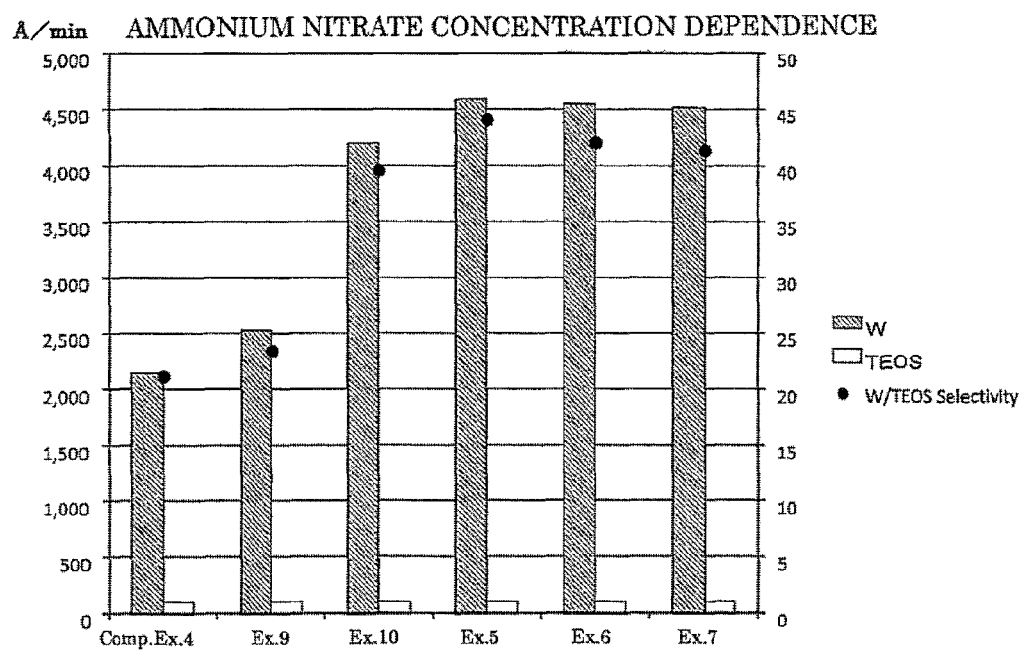
FIG. 5 is a graph showing the relationship between the ammonium nitrate concentration and the polishing rate for tungsten and a TEOS film.

FIG. 5 shows a bar graph of the tungsten polishing rate, the TEOS polishing rate, and the tungsten/TEOS polishing rate ratio in Comparative Example 4 and Examples 5, 6, 7, 9, and 10.

It is apparent from FIG. 5 that when ammonium nitrate concentration is changed to 0%, 0.1%, 0.5%, 1.0%, 2.0%, and 3.0%, the TEOS polishing rate hardly changes, but the tungsten polishing rate is increased at 0.5% or more, that is, the selectivity to tungsten is higher.

<<Influence of Strong Acid/Hydrogen-Ion-Supplying Agent>>

There were prepared polishing compositions of Examples 11 and 12 in which hydrochloric acid and sulfuric acid were used, respectively, instead of nitric acid as a strong acid, and polishing compositions of Examples 13 and 14 in which ammonium sulfate and oxalic acid were used, respectively, instead of ammonium nitrate as a hydrogen-ion-supplying agent, each in a formulation as shown in Table 3. These polishing compositions were measured for the tungsten polishing rate and the TEOS polishing rate as described above. For comparison purposes, Example 5 was shown in Table 3. The materials used other than those described above were as follows.

Hydrochloric acid: 36% (% by mass in the table is % by mass as HCl)

Sulfuric acid: 98% (% by mass in the table is % by mass as $H_2SO_4$)

Ammonium sulfate: 99% (% by mass in the table is % by mass as $(NH_4)_2SO_4$)

Oxalic acid: 98% (% by mass in the table is % by mass as $H_2C_2O_4$)

Figure 6:
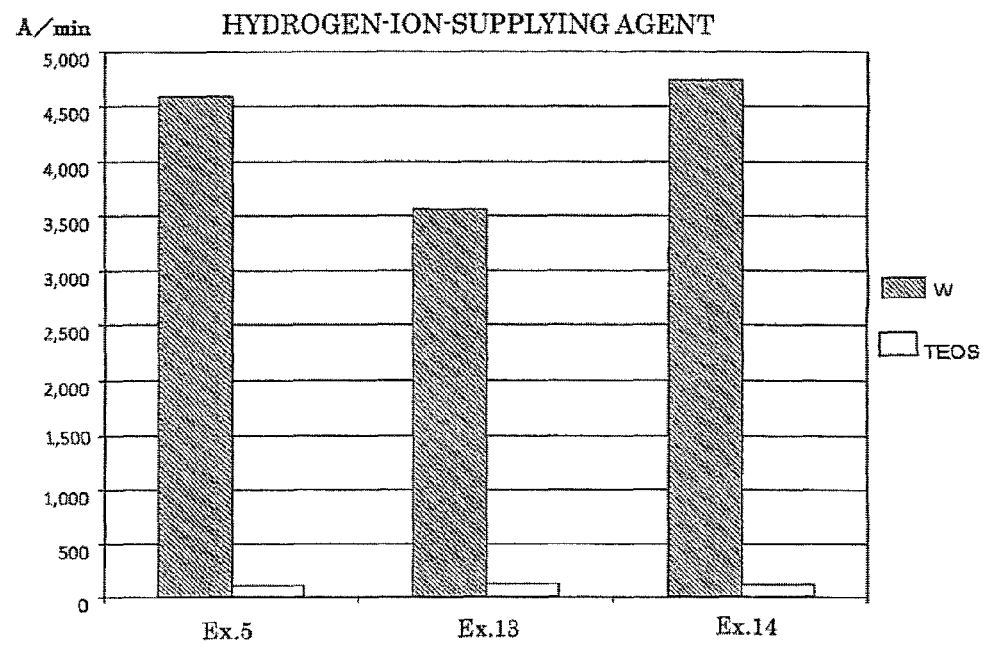
FIG. 6 is a graph showing the relationship between the type of hydrogen-ion-supplying agent and the polishing rate for tungsten and a TEOS film.
Figure 7:
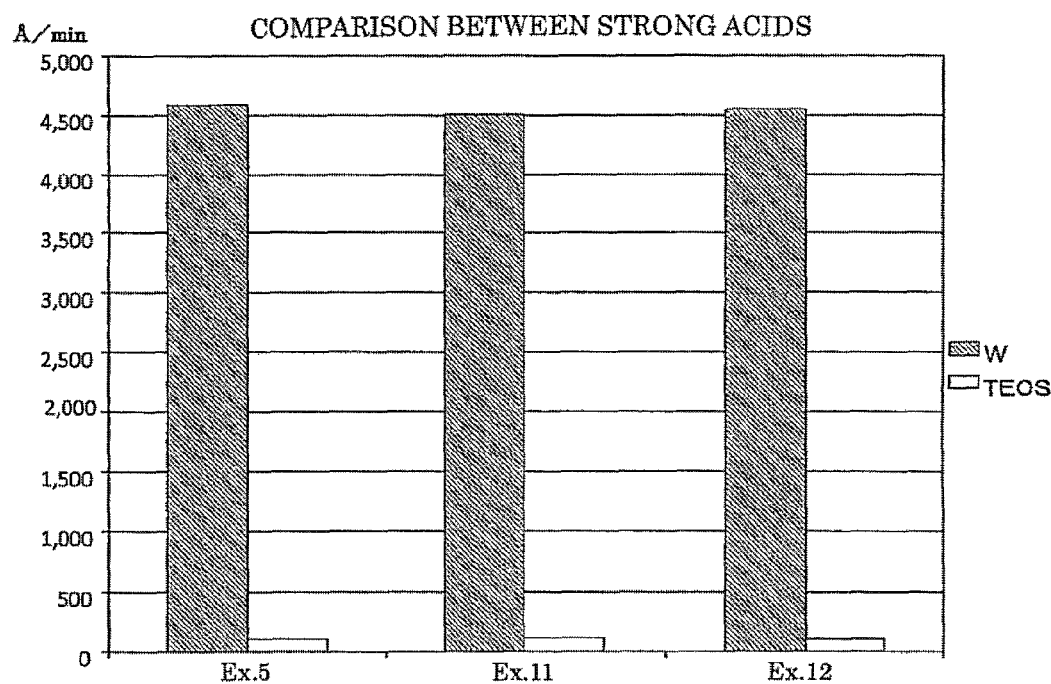
FIG. 7 is a graph showing the relationship between the type of strong acid and the polishing rate for tungsten and a TEOS film

The results are shown in Table 3 and FIGS. 6 and 7.

TABLE 3

| | A Wt % | B Wt % | C Wt % | D Wt % | X mol/l | Y = a + b mol/l | 1.2*Y mol/l | 1.2*Y/X mol/l | W Polishing rate Å/min | TEOS polishing rate Å/min | W/TEOS Polishing rate ratio |
|---|---|---|---|---|---|---|---|---|---|---|---|
| Example 5 | 3 | 0.3 | 0.12 | 1.0 | 0.102 | 0.16 | 0.19 | 1.82 | 4584 | 104 | 44 |
| Example 11 | 3 | 0.3 | Hydrochloric acid 0.23 | 1.0 | 0.102 | 0.16 | 0.19 | 1.82 | 4497 | 113 | 40 |
| Example 12 | 3 | 0.3 | Sulfuric acid 0.16 | 1.0 | 0.102 | 0.16 | 0.19 | 1.82 | 4551 | 107 | 43 |
| Example 13 | 3 | 0.3 | 0.07 | Ammonium sulfate 1.0 | 0.102 | 0.11 | 0.13 | 124 | 3567 | 123 | 29 |
| Example 14 | 3 | 0.3 | 0.07 | Oxalic acid 1.0 | 0.102 | 0.14 | 0.17 | 1.66 | 4732 | 114 | 42 |

<<Influence of Abrasive Grains>>

Polishing compositions of Examples 15 to 18 were prepared each in a formulation as described in Table 4 and measured for the tungsten polishing rate and the TEOS polishing rate as described above.

The abrasive grains used are as follows.

Figure 8:
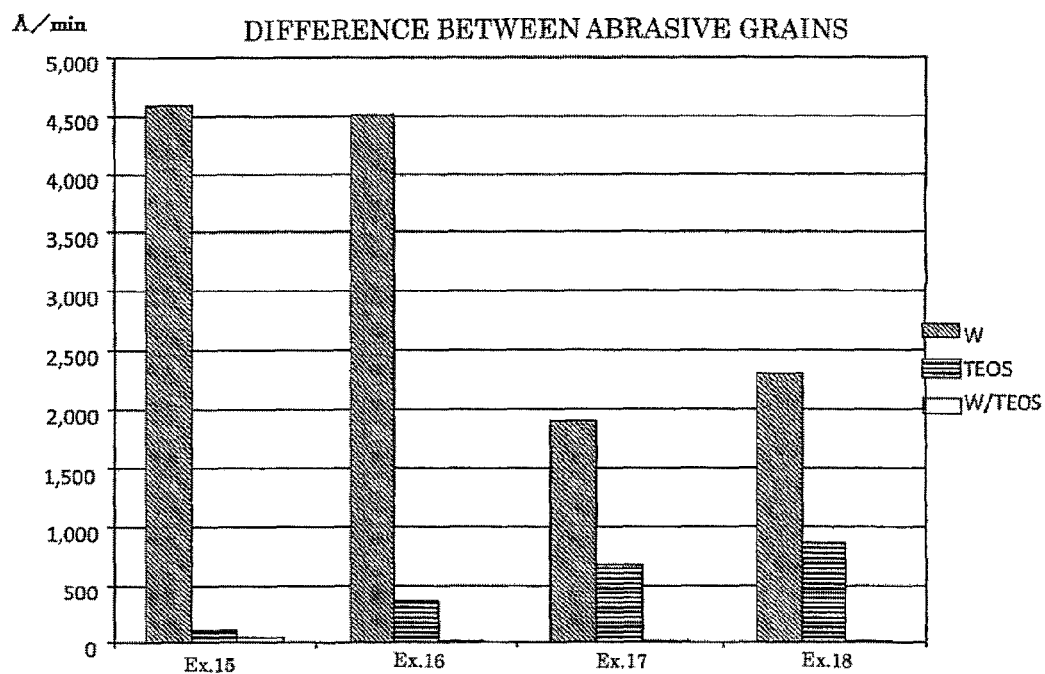
FIG. 8 is a graph showing the relationship between the type of abrasive grains and the polishing rate for tungsten and a TEOS film.

Fumed silica A: an average particle size of 130 nm
Fumed silica B: an average particle size of 150 nm
Colloidal silica A: an average particle size of 130 nm
Colloidal silica B: an average particle size of 50 nm
The results are shown in Table 4 and FIG. 8.

TABLE 4

| | Type | Average particle size nm | A Wt % | B Wt % | C Wt % | D Wt % | X mol/l | Y = a + b mol/l | 1.2*Y mol/l | 1.2*Y/X mol/l | W Polishing rate Å/min | TEOS polishing rate Å/min | W/TEOS Polishing rate ratio |
|---|---|---|---|---|---|---|---|---|---|---|---|---|---|
| Example 15 | Fumed | 130 | 3 | 0.3 | 0.12 | 1.0 | 0.102 | 0.16 | 0.19 | 1.82 | 4584 | 104 | 44 |
| Example 16 | Fumed | 150 | 3 | 0.3 | 0.05 | 1.0 | 0.102 | 0.16 | 0.19 | 1.82 | 4507 | 362 | 12 |
| Example 17 | Colloidal | 130 | 3 | 0.3 | 0.39 | 1.0 | 0.102 | 0.16 | 0.19 | 1.82 | 1901 | 682 | 3 |
| Example 18 | Colloidal | 50 | 3 | 0.3 | 0.05 | 1.0 | 0.102 | 0.16 | 0.19 | 1.82 | 2304 | 870 | 3 |

The invention claimed is:

1. A polishing composition for polishing a tungsten-containing metal layer formed on an insulating layer, the polishing composition comprising:
    abrasive grains;
    one or more halogen acids selected from the group consisting of iodic acid, iodous acid, and hypoiodous acid;
    a strong acid;
    a hydrogen-ion-supplying agent; and
    water, wherein
    the strong acid and the hydrogen-ion-supplying agent are blended into the polishing composition at a ratio of strong acid:hydrogen-ion-supplying agent=1:1 to 1:50 in terms of the molar concentration ratio of the hydrogen ions ionized from the respective components.

2. The polishing composition according to claim 1, wherein the hydrogen-ion-supplying agent is selected from the group consisting of a weak acid and a salt, wherein the salt is of a strong acid and a weak base.

3. The polishing composition according to claim 1, wherein the strong acid is one or more selected from the group consisting of nitric acid, hydrochloric acid, and sulfuric acid.

4. The polishing composition according to claim 1, wherein the abrasive grains are fumed silica.

* * * * *